US012586651B2

(12) United States Patent
Zhou et al.

(10) Patent No.: US 12,586,651 B2
(45) Date of Patent: Mar. 24, 2026

(54) MEMORY SYSTEMS, OPERATING METHODS AND READABLE STORAGE MEDIUMS

(71) Applicant: Yangtze Memory Technologies Co., Ltd., Wuhan (CN)

(72) Inventors: Teng Zhou, Wuhan (CN); Lin Zhang, Wuhan (CN); Tao Xiong, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 80 days.

(21) Appl. No.: 18/672,933

(22) Filed: May 23, 2024

(65) Prior Publication Data

US 2025/0308603 A1     Oct. 2, 2025

(30) Foreign Application Priority Data

Apr. 2, 2024     (CN) .......................... 202410396497.7

(51) Int. Cl.
*G11C 16/00*     (2006.01)
*G11C 16/28*     (2006.01)
*G11C 16/32*     (2006.01)

(52) U.S. Cl.
CPC .............. *G11C 16/28* (2013.01); *G11C 16/32* (2013.01)

(58) Field of Classification Search
CPC . G11C 16/0483; G11C 11/5642; G11C 16/10; G11C 11/5671; G11C 16/08; G11C 29/52; G11C 16/32; G11C 11/5628; G11C 16/3418; G11C 16/30; G11C 2029/0409; G11C 29/021; G11C 29/42; G11C 29/028; G11C 16/14; G11C 16/16; G11C 16/28; G11C 16/3459; G11C 11/5621; G11C 16/24; G11C 16/349; G11C 2211/5621; G11C 2211/563; G11C 2211/5641; G11C 29/44; G11C 7/04; G11C 11/4074; G11C 11/4085; G11C 11/5635; G11C 16/0408; G11C 16/0466; G11C 16/3427; G11C 2211/5644; G11C 16/3404; G11C 16/3445; G11C 2029/1202; G11C 29/022; G11C 11/56; G11C 16/04; G11C 2029/0411; G11C 2207/2254; G11C 2211/5642; G11C 29/00; G11C 7/1069; G11C 11/4072;
(Continued)

(56) References Cited

U.S. PATENT DOCUMENTS

2018/0225164 A1*   8/2018   Khoueir ............... G06F 11/076

* cited by examiner

*Primary Examiner* — Thong Q Le
(74) *Attorney, Agent, or Firm* — HANLEY, FLIGHT & ZIMMERMAN, LLC

(57)     ABSTRACT

Examples of the present application disclose a memory system, a method of operating the same and readable storage medium. The memory system includes: a memory device and a memory controller coupled with the memory device, wherein the memory controller is configured to: acquire operating temperatures of the memory device in time sequence, and determine an equivalent duration under a set temperature of a first duration for which the operating temperature lasts; accumulate the equivalent duration corresponding to the first duration; and control the memory device to perform dummy read operation in response to the accumulated equivalent duration being greater than or equal to a second duration; wherein the second duration is a time interval with which the memory device is triggered periodically to perform the dummy read operation under the set temperature.

20 Claims, 11 Drawing Sheets

(58) Field of Classification Search
CPC ............ G11C 11/4076; G11C 11/4093; G11C
11/4096; G11C 11/4099; G11C 16/107;
G11C 16/12; G11C 16/22; G11C
16/3431; G11C 16/3477; G11C
2029/1204; G11C 2029/3602; G11C
29/12005; G11C 29/36; G11C 29/38
USPC ............ 365/153.17, 185.18, 185.03, 185.02,
365/185.2, 185.24, 185.09, 185.11,
365/185.23, 185.33, 189.15
See application file for complete search history.

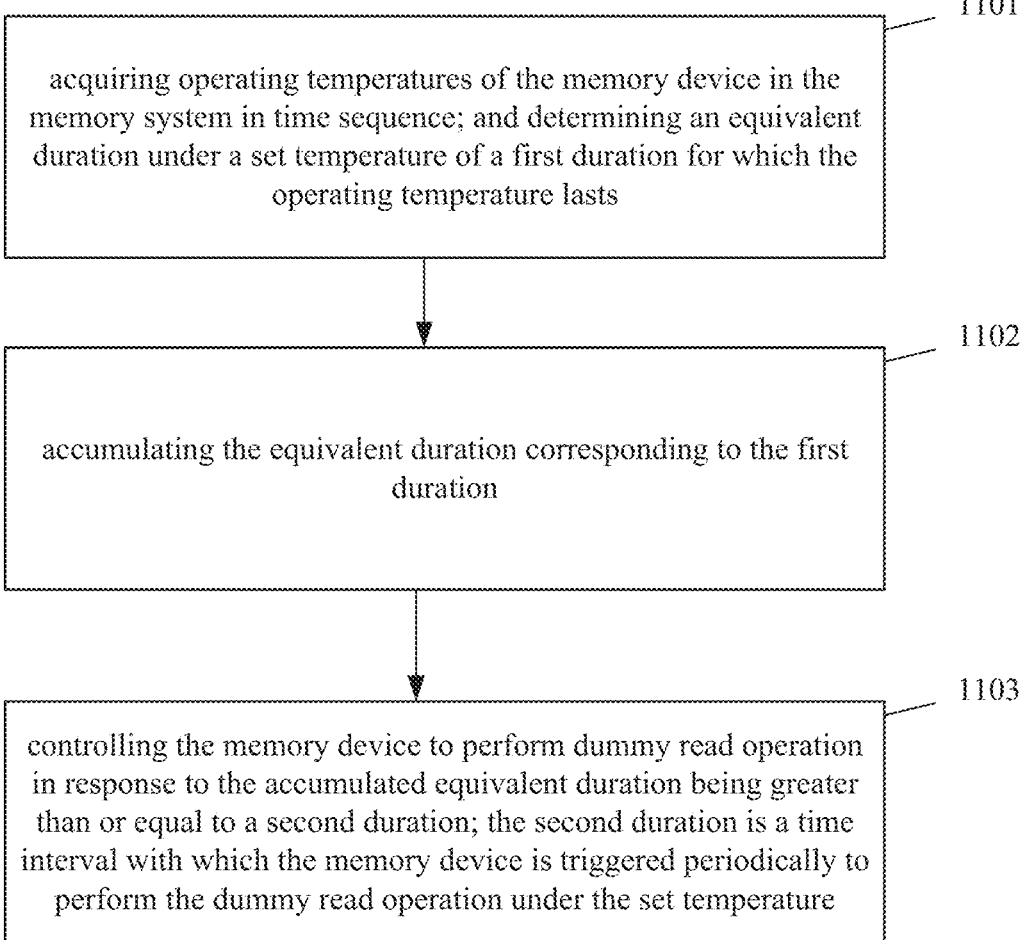

1101 acquiring operating temperatures of the memory device in the memory system in time sequence; and determining an equivalent duration under a set temperature of a first duration for which the operating temperature lasts

1102 accumulating the equivalent duration corresponding to the first duration

1103 controlling the memory device to perform dummy read operation in response to the accumulated equivalent duration being greater than or equal to a second duration; the second duration is a time interval with which the memory device is triggered periodically to perform the dummy read operation under the set temperature

FIG. 11

MEMORY SYSTEMS, OPERATING METHODS AND READABLE STORAGE MEDIUMS

CROSS-REFERENCE TO RELATED APPLICATION

The present application claims the benefit of priority to China Application No. 202410396497.7, filed on Apr. 2, 2024, the content of which is incorporated herein by reference in its entirety.

TECHNICAL FIELD

The present application relates to a field of memory technology, particularly to memory systems, operating methods and readable storage mediums.

BACKGROUND

Memory devices are storage apparatus for saving information in modern information technology. As a typical non-volatile semiconductor memory, NAND (Not-And) type memory has gradually become the mainstream product in the memory market due to its high memory density, controllable production cost, suitable programing and erasing speeds and retention characteristics.

BRIEF DESCRIPTION OF DRAWINGS

In the figures drawn not necessarily to scale, the same reference numerals may describe similar parts in different views. The same numerals with different character suffixes may represent different instances of similar parts. The accompanying drawings illustrate various examples discussed in the present document in general by example rather than limitation.

FIG. 11 is a flow diagram of an operating method of a memory system provided in an example of the present application.

DETAILED DESCRIPTION

Figure 1:
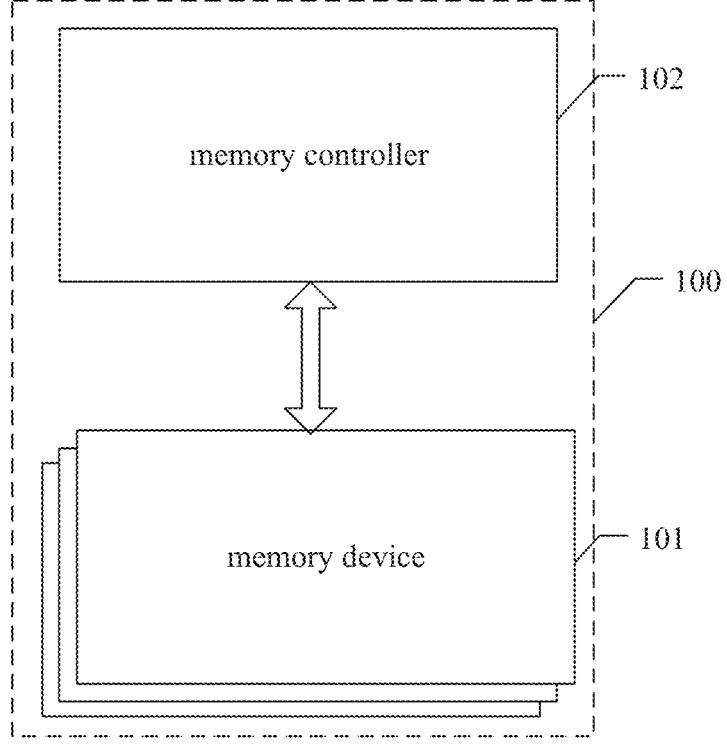
FIG. 1 is a structure diagram of a memory system provided in an example of the present application.

Example implementations of the present application will be described in greater detail below with reference to the accompanying drawings. Although example implementations of the present application are shown in drawings, it is to be appreciated that the present application may be implemented in various forms rather than being limited to the specific implementations as set forth herein. In contrast, these implementations are provided to understand the present application more thoroughly and convey the scope of the present application completely to those skilled in the art.

In the following description, a large amount of specific details is presented to provide thorough understanding of the present application. However, it is obvious to one skilled in the art that the present application may be implemented without one or more of these details. In other examples, in order to avoid obscure the present application, some technical features well known in the art are not described. That is, not all features of the practical examples are described herein, and well-known functions and structures are not described.

In the accompanying drawings, sizes and relative sizes of layers, regions and elements may be exaggerated for purpose of clarity. The same reference numerals refer to the same elements throughout.

It should be understood that while an element or a layer is said to be "on", "adjacent to", "connected to" or "coupled to" other elements or layers, it may be directly on, adjacent to, connected to or coupled to other elements or layers, or there may be intervening elements or layers. To the contrary, while an element is said to be "directly on", "directly adjacent to", "directly connected to" or "directly coupled to" other elements or layers, there is no intervening elements or layers. It is to be appreciated that although terms such as first, second, third etc. may be used to describe elements, components, regions, layers and/or parts, these elements, components, regions, layers and/or parts should not be limited by these terms. These terms are only used to differentiate one element, component, region, layer or part from another element, component, region, layer or part. Therefore, without departing from the teaching of the present application, the first element, component, region or part discussed below may represent the second element, component, region, layer or part. While discussing the second element, component, region, layer or part, it does not necessarily indicate there is the first element, component, region, layer or part in the present application.

Spatial relationship terms such as "under", "below", "beneath", "over", "on" etc. may be used herein for convenient description to describe the relationship of one element or feature shown in the drawings relative to other elements or features. It is to be appreciated that spatial relationship terms are further intended to include different orientations of devices in use and operation in addition to orientations shown in the figures. For example, if the device in a figure is inverted, then an element or feature described as "under" or "below" or "beneath" another element or feature will be oriented "on" the other element or feature. Accordingly, example terms "under" and "below" may include two orientations of "on" and "under". A device may be otherwise oriented (rotated by 90 degrees or other orientations) and spatial description terms used herein should be interpreted accordingly.

Terms are used herein only for describing specific examples rather than limiting the present application. As used herein, the singular form "a", "an" and "the" are also intended to include the plural form unless otherwise stated in the context. It is also understood that while used in the description, terms "consist" and/or "include" confirm the presence of said features, integers, steps, operations, elements and/or components, but do not exclude the presence or addition of one or more other features, integers, steps, operations, elements and/or components. As used herein, the term "and/or" includes any and all combinations of relevant listed items.

In in order to understand characteristics and technology contents of examples of the present application in more detail, examples of the present application will be described with reference to the accompanying drawings that are only for the purpose of reference rather than limiting examples of the present application.

It should be understood that "one example" or "some examples" as mentioned throughout the description means that particular features, structures, or characteristics related to the example are included in at least one example of the present application. Therefore, "in one example" or "in some examples" appearing throughout the description does not necessarily refer to the same example. In addition, these particular features, structures, or characteristics may be incorporated in one or more examples in any suitable manners. It should be understood that in various examples of the present application, the sequence numbers of the above-described processes do not mean the sequential order of executions. The execution order of the processes should be determined by their functions and internal logics and should not limit the implementation process of the examples of the present application. The sequence numbers of the above-described examples of the present application are only for the purpose of description rather than representing strengths and weaknesses of examples.

The methods disclosed in the method examples provided in the present application may be combined in any manner without conflicts to obtain new method examples.

The examples of the present application will be descried in more detail below with respect to accompany drawings and specific examples.

Referring to FIG. 1, which illustrates a structure diagram of the memory system provided in an example of the present application. As shown in FIG. 1, the memory system 100 may include: a memory device 101 and a memory controller 102 coupled with the memory device, wherein the memory controller 102 is configured to: acquire operating temperatures of the memory device in time sequence and determine an equivalent duration under a set temperature of the first duration for which the operating temperature lasts; accumulate equivalent duration corresponding to the first duration; control the memory device to perform dummy read operation in response to the accumulated equivalent duration being greater than or equal to a second duration; wherein the second duration is a time interval for triggering the memory device to perform the dummy read operation periodically under the set temperature.

Figure 2:
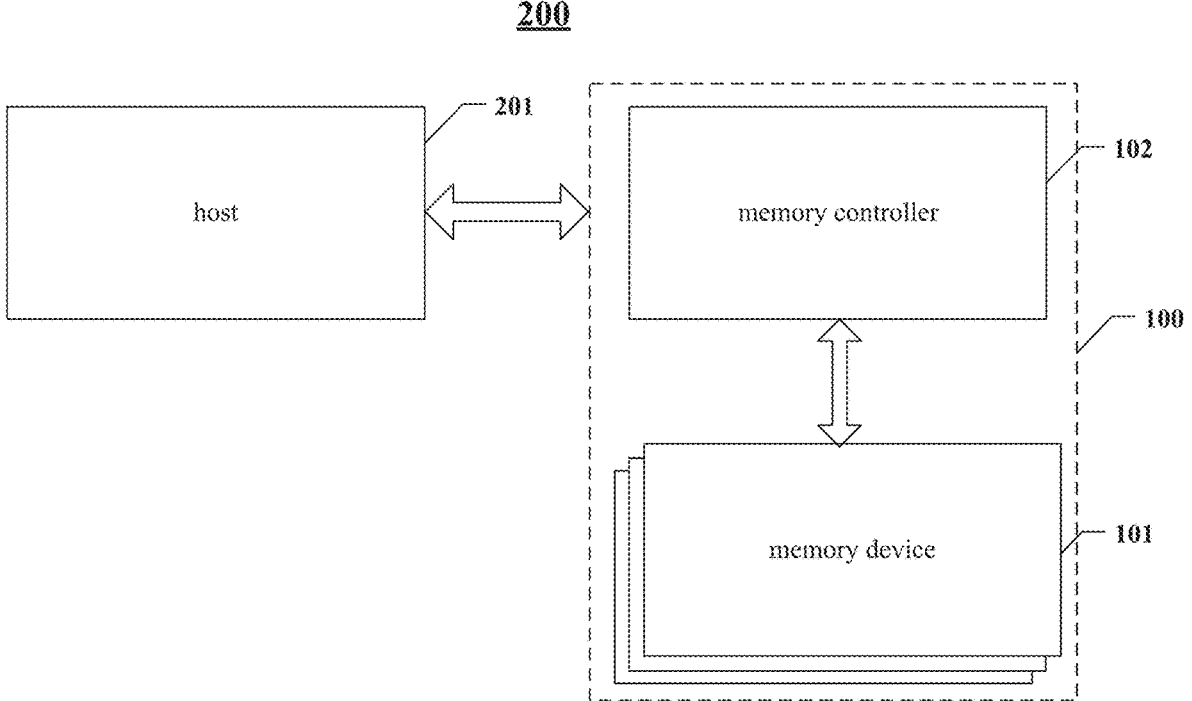
FIG. 2 is a structure diagram of an example system containing a memory system provided in an example of the present application.

It is to be noted that the memory system 100 may communicate with the host. Said host and/or said memory system 100 may be included in various products such as Internet of Things (IoT) devices such as refrigerators or other devices, sensors, motors, mobile communication devices, automobiles, unmanned cars for supporting processing, communication or control of products. In some examples, as shown in FIG. 2, FIG. 2 illustrates a schematic diagram of an example system having a memory system provided in an example of the present application. In FIG. 2, the system 200 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic apparatus having storage therein. As shown in FIG. 2, the system 200 may include a host 201 and a memory system 100, wherein the memory system 100 has one or more memory devices 101 and a memory controller 102, the host 201 may be a processor of the electronic apparatus such as a central processing unit (CPU) or a system-on-chip (SoC), in which the SoC may be for example an application processor (AP). The host 201 may be configured to send data to the memory device 101 or receive data from the memory device 101. In an example, the memory device 101 may be any of the memories disclosed in the present application. For example, phase change random access memories (PCRAM) and three-dimension NAND flashes etc.

According to some implementations, the memory controller 102 is coupled to the memory device 101 and the host 201, and is configured to control the memory device 101. The memory controller 102 can manage the data stored in the memory device 101 and communicate with the host 201. In some examples, the memory controller 102 is designed for operating in a low duty-cycle environment such as secure digital (SD) cards, compact Flash (CF) cards, universal serial bus (USB) Flash drives, or other media for use in electronic apparatuses of low duty-cycle environments such as personal computers, digital cameras, mobile phones, etc. In some examples, the memory controller 102 is designed to operate in high duty cycle environments such as solid state drive (SSD) or embedded Multi Media Card (eMMC), wherein SSD or eMMC are used as e.g., data stores and enterprise memory arrays of the mobile devices of high duty cycle environments such as smart phones, tablet computers and laptop computers. The memory controller 102 can be configured to control operations of the memory device 101, such as read, erase, and program operations. The memory controller 102 can also be configured to manage various functions with respect to the data stored or to be stored in the memory device 101 including, but not limited to bad-block management, garbage collection, logical-to-physical address conversion, wear leveling, etc. In some implementations, the memory controller 102 is further configured to process error correction codes (ECCs) with respect to the data read from or written to the memory device 101. Any other suitable functions may be performed by the memory controller 102 as well, for example, formatting the memory device 101. The memory controller 102 can communicate with an external device (e.g., the host 201) according to a particular communication protocol. For example, the memory controller 102 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 3:
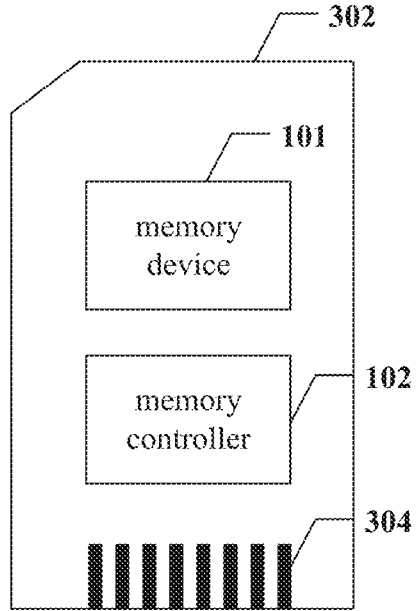
FIG. 3 is a diagram of an example memory card containing a memory system provided in an example of the present application.
Figure 4:
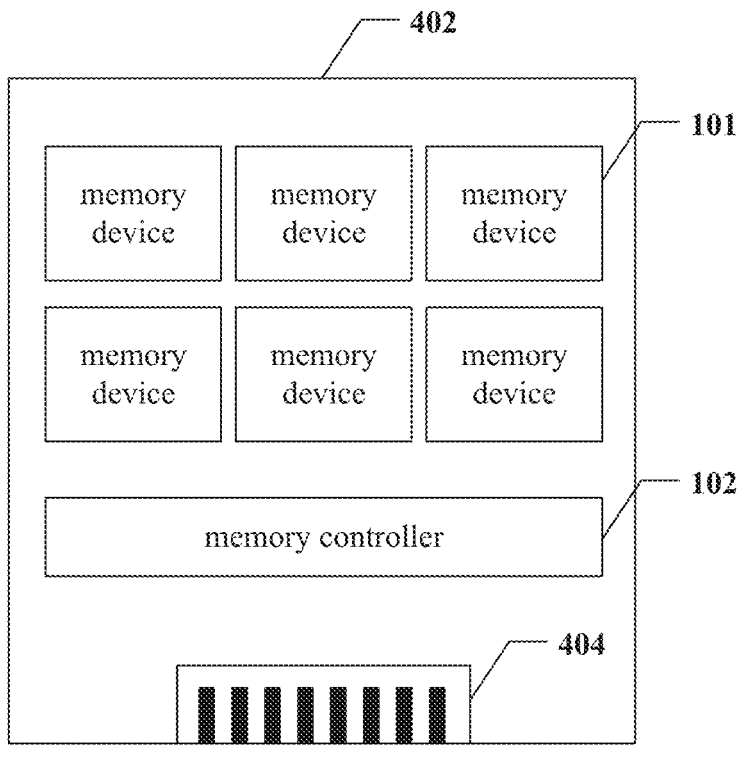
FIG. 4 is a diagram of an example solid state drive (SSD) containing a memory system provided in an example of the present application.

In some examples, the memory controller 102 and one or more memory devices 101 can be integrated into various types of storage apparatuses, for example, be included in the same package, such as a universal Flash storage (UFS) package or an eMMC package. That is, the memory system 100 can be implemented and packaged into different types of terminal electronic products. In one example as shown in FIG. 3, the memory controller 102 and a single memory device 101 can be integrated into a memory card 302. The memory card may include a PC card (PCMCIA, Personal Computer Memory Card International Association), a CF card, a smart media (SM) card, a memory stick, a multimedia card (MMC, RS-MMC, MMCmicro), a SD card (SD, miniSD, microSD, SDHC), a UFS etc. The memory card may also include a memory card connector 304 coupling the memory card and the host (e.g., the host 201 in FIG. 2). In another example as shown in FIG. 4, the memory controller 102 and multiple memory devices 101 can be integrated into a solid state drive (SSD) 402. The SSD may also include an SSD connector 404 coupling the SSD and the host (e.g., the host 201 in FIG. 2). In some implementations, the memory capacity and/or operating speed of SSD are greater than the memory capacity and/or operating speed of the memory card. Furthermore, the memory controller 102 can be further configured to control read, erase, and write operations of the memory device 101.

Here, said memory device 101 may refer to a device for saving programs and/or data that may contain memory cell arrays and peripheral circuits, wherein the memory cell arrays may be storage media for storing programs and/or data while peripheral circuits are general terms for various circuits configured to control the memory cell arrays so as to store programs and/or data in the memory cell arrays.

Figure 5:
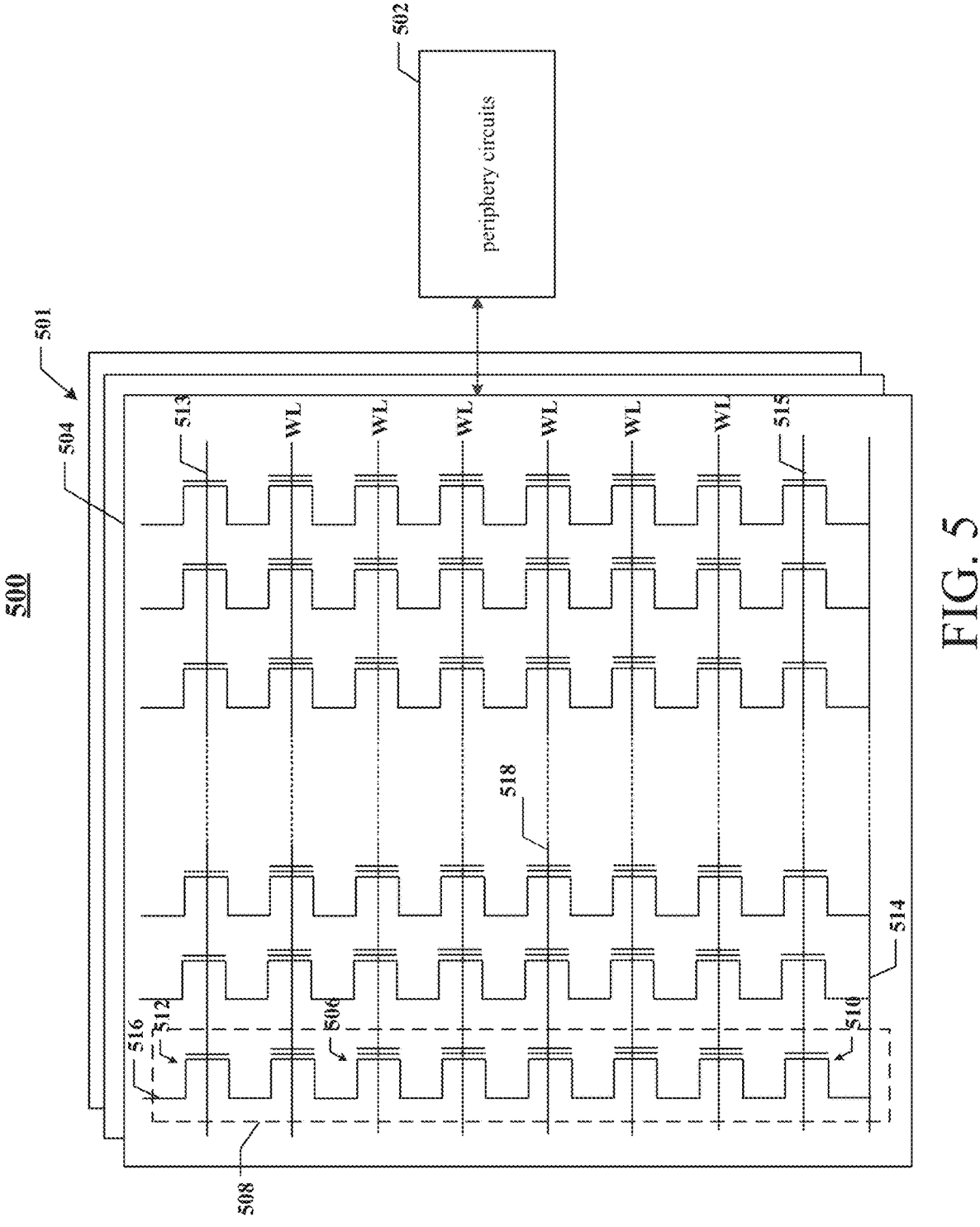
FIG. 5 is a structure diagram of a memory device containing peripheral circuits and memory cell arrays provided in an example of the present application.

Illustratively, referring to FIG. 5, FIG. 5 illustrates a structure diagram of a memory device 500 containing peripheral circuits and a memory cell array. As shown in FIG. 5, the memory device 500 may be a NAND flash memory device, which is an example of the memory device 101 in FIG. 1, which includes a memory cell array 501 and peripheral circuits 502, wherein the memory cells 506 of the memory cell array 501 are provided in form of an array of NAND memory strings 508 and each NAND memory string 508 extends vertically over the substrate (not shown). In some examples, each NAND memory string 508 includes a plurality of memory cells 506 coupled in series and stacked vertically. Each memory cell 506 can remain continuous analog values, for example, voltages or charges, depending on the number of electrons trapped in the storage region of the memory cell 506. Each memory cell 506 may be a memory cell of a floating-gate type that includes floating-gate transistors or a memory cell of a charge trap (CT) type that includes charge trapping transistors.

In some examples, each memory cell 506 is a single-level cell (SLC) that has two possible data states and can therefore store one bit of data. For example, a first data state "0" may correspond to a first voltage range, and a second data state "1" may correspond to a second voltage range. In some examples, the first voltage range and the second voltage range may be referred to as the threshold voltage distribution of a memory cell. In some examples, each memory cell 506 may be a multi level cell (MLC). For example, a MLC may store two bits per cell (also known as double level cell (DLC)); or as another example, three bits per cell (also known as TLC, Trinary Level Cell) or four bits per cell (also known as QLC, Quadruple Level Cell). Among them, data states of whatever types of memory cells contain one erasing state and (one or more) programming states, and while programming memory cells, the memory cells in erasing state are programmed to a certain programming state. Generally, the voltage value in the voltage range corresponding to the programming state of a memory cell is larger.

As shown in FIG. 5, each NAND memory string 508 may include a source select gate (SSG) 510 at its source end and a drain select gate (DSG) 512 at its drain end. SSG 510 and DSG 512 may be configured to activate the selected NAND memory string 508 (a column of the array) during reading and programming (or writing) operations. In some examples, sources of NAND memory strings 508 in the same memory block 504 are coupled through the same source line (SL) 514, such as the common SL. In other words, according to some implementations, all NAND memory strings 508 in the same memory block 504 have an array common source (ACS). According to some implementations, DSG 512 of each NAND memory string 508 is coupled to a corresponding bit line 516 and data may be read from and written into the bit line 516 via an output bus (not shown). In some examples, each NAND memory string 508 is configured to be selected or deselected by applying a select voltage (for example higher than the threshold voltage of the transistor having DSG 512) or a deselect voltage (for example, 0V) to the corresponding DSG 512 via one or more drain select line or top select line 513 and/or applying a select voltage (for example higher than the threshold voltage of the transistor having SSG 510) or a deselect voltage (for example, 0V) to the corresponding SSG 510 via one or more source select line or bottom select line 515.

As shown in FIG. 5, the NAND memory string 508 may be organized into a plurality of memory blocks 504 and each of the plurality of memory blocks 504 may have a common source line 514 (coupled to ground for example). In some examples, each memory block 504 is the basic data unit having erase operation. That is, all memory cells 506 on the same memory block 504 are erased at the same time. In order to erase the memory cells 506 in a selected memory block 504, it is possible to bias the source line 514 coupled to the selected memory block 504 and the unselected memory blocks 504 in the same plane as the selected memory block 504 with an erase voltage (Vers) (for example, a high positive voltage of 20V or higher). It will be appreciated that in some examples, it is possible to perform erase operation on the semi-block level, the quarter-block level or a level of any suitable number of blocks or any suitable fraction of a block. As shown in FIG. 5, memory cells 506 of adjacent NAND memory strings 508 may be coupled via word line 518. That is, the same word line 518 may be coupled with memory cells in same locations (namely corresponding memory cells) in a plurality of memory strings.

Figure 6:
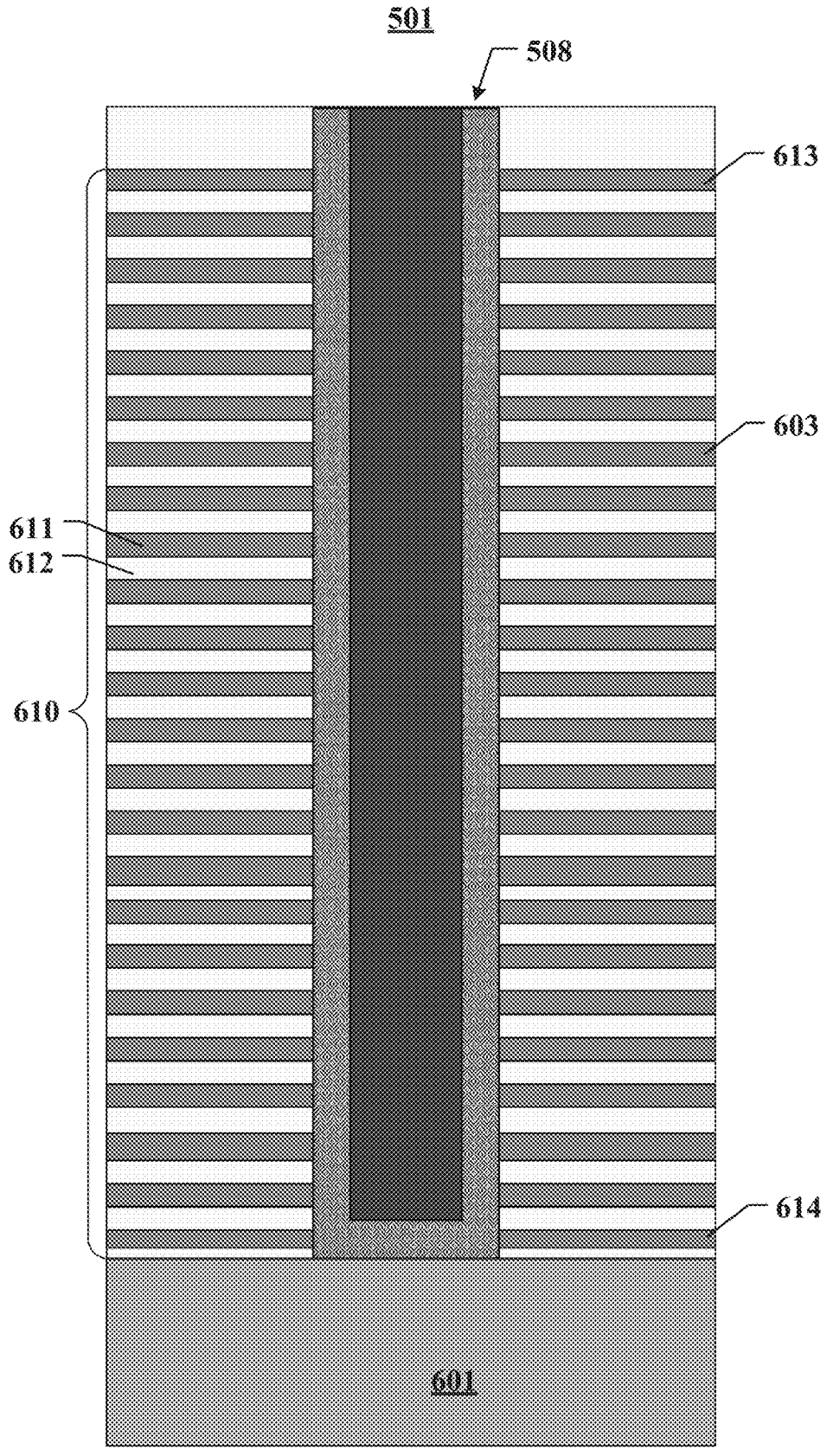
FIG. 6 is a cross-section view of an example memory cell array containing NAND memory strings provided in an example of the present application.

FIG. 6 shows a side view of a cross-section of an example memory cell array 501 including NAND memory strings 508 according to some aspects of the present application. As shown in FIG. 6, a NAND memory string 508 may include a stack 610 including a plurality of gate layers 611 and a plurality of insulating layers 612 stacked alternatively and the memory strings 508 penetrating the gate layers 611 and the insulating layers 612 vertically. The gate layers 611 and the insulating layers 612 may be stacked alternatively and adjacent two gate layers 611 are separated by an insulating layer 612. The number of the pairs of gate layers 611 and insulating layers 612 in the stack 610 may determine the number of the memory cells included in the memory cell array 501.

The material for the gate layers 611 may include conductive materials. The conductive materials include, but not limited to tungsten (W), cobalt (Co), copper (Cu), aluminum (Al), polysilicon, doped silicon, silicide or any combination thereof. In some implementations, each gate layer 611 includes a metal layer such as a tungsten layer. In some implementations, each gate layer 611 includes a doped polysilicon layer. Each gate layer 611 may include a control gate surrounding the memory cells. The gate layer 611 at the top of the stack 610 may extend laterally to serve as an upper select gate line 613, i.e., drain selective line or top selective line 513, wherein the upper selective gate line 613 is the leading-out line for the drain selective gate (DSG) 512 as described above to connect to corresponding select voltage or de-select voltage. The gate layer 611 at the bottom of the stack 610 may extend laterally to serve as the lower selective gate line 614, i.e., source selective line or bottom selective line 515, wherein the lower selective gate line 614 is the leading-out line for the source selective gate (SSG) 510 as described above to connect to corresponding select voltage or de-select voltage. The gate layer 611 extending laterally between the drain selective gate line and the source selective gate line may serve as word line layers 603, which are the above-described word lines 518.

In some examples, the stack 610 may be disposed on the substrate 601. The substrate 601 may include silicon (e.g., single crystalline silicon), silicon germanium (SiGe), gallium arsenide (GaAs), germanium (Ge), silicon-on-insulator (SOI), germanium-on-insulator (GOI) or any other suitable material.

In some examples, the NAND memory string 508 includes a channel structure extending vertically through the stack 610. In some implementations, the channel structure includes a channel hole filled with (one or more) semiconductor materials (e.g., serving as the semiconductor channel) and (one or more) dielectric materials (e.g., serving as the memory film). In some implementations, the semiconductor channel includes silicon, such as polysilicon. In some implementations, the memory film is a composite dielectric layer including a tunneling layer, a storage layer (also known as "charge trapping/storage layer") and a barrier layer. The channel structure may have a cylindrical shape (e.g., a pillar shape). According to some implementations, the semiconductor channel, the tunneling layer, the storage layer and the barrier layer are arranged radially from the center towards the outer surface of the pillar in this order. The tunneling layer may include silicon oxide, silicon oxynitride or any combination thereof. The storage layer may include silicon nitride, silicon oxynitride or any combination thereof. The barrier layer may include silicon oxide, silicon oxynitride, high dielectric constant (high-k) dielectric or any combination thereof. In one example, the memory film may include a composite layer of silicon oxide/silicon oxynitride/silicon oxide (ONO).

Figure 7:
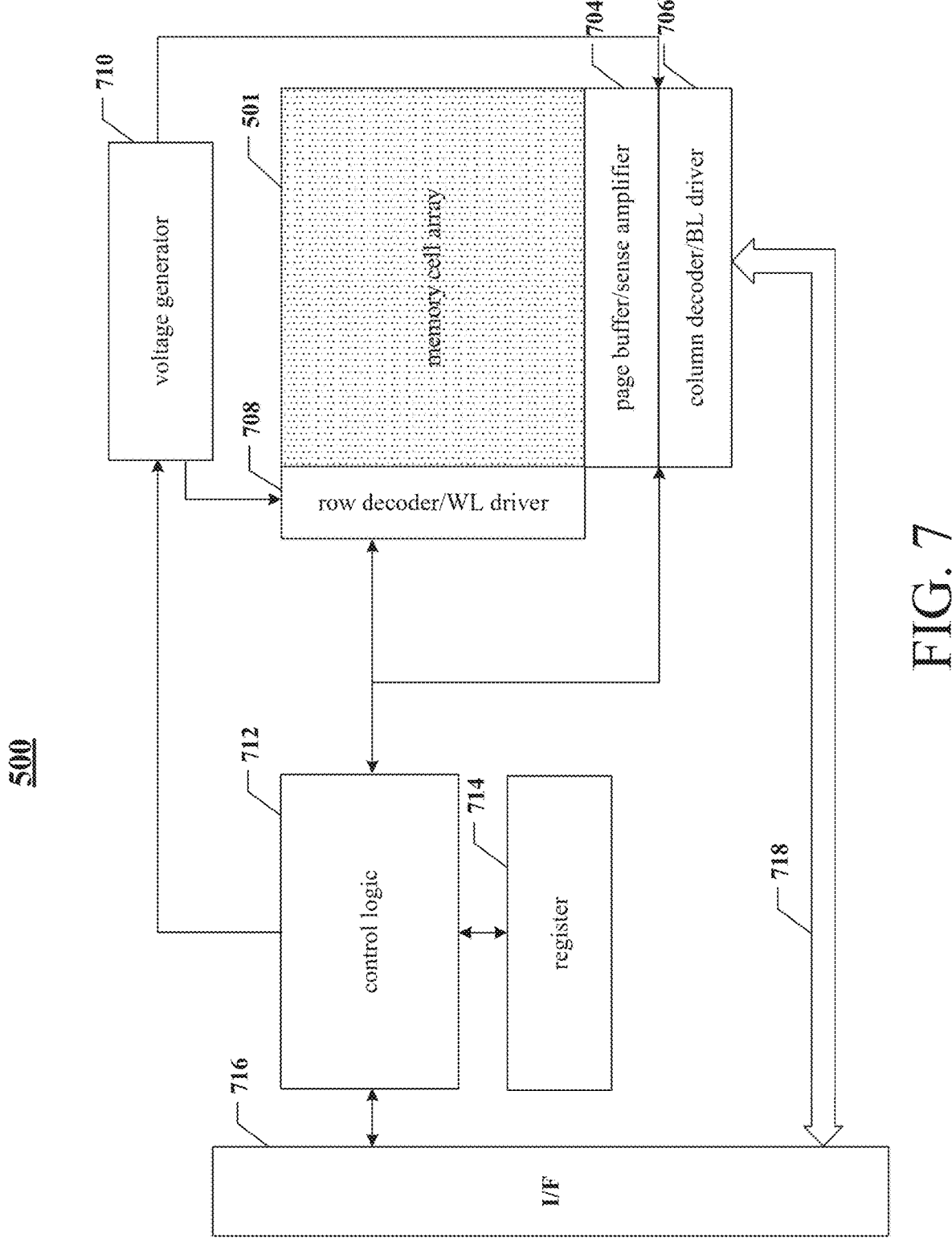
FIG. 7 is a structure diagram of a peripheral circuit provided in an example of the present application.

Referring back to FIG. 5, the peripheral circuits 502 may be coupled to the memory cell array 501 through the bit line 516, the word line 518, the source line 514, the SSG line 515 and the DSG line 513. The peripheral circuits 502 may include any suitable analog, digital and hybrid signal circuits for facilitating operation of the memory cell array 501 by applying voltage signals and/or current signals to each target memory cell 506 via bit lines 516, word lines 518, source lines 514, SSG lines 515 and DSG lines 513 and sensing voltage signals and/or current signals from each target memory cell 506. The peripheral circuits 502 may include various types of peripheral circuits formed by metal-oxide-semiconductor (MOS) technology. As an example, FIG. 7 shows some example peripheral circuits. The peripheral circuit 502 includes a page buffer/sense amplifier 704, a column decoder/bit line driver 706, a row decoder/word line driver 708, a voltage generator 710, a control logic 712, a register 714, an interface 716 and a data bus 718. It should be understood that in some examples, additional circuits not shown in FIG. 7 may be further included.

In an example, the page buffer/sense amplifier 704 may be configured to read and program (write) data from/to the memory cell array 501 according to control signals from control logic 712. In one example, the page buffer/sense amplifier 704 may store programming data (or known as writing data) to be programed into memory cells coupled with one word line in the memory cell array 501. In another example, the page buffer/sense amplifier 704 may perform the programming verification operation to ensure that the data has been properly programed into the memory cells 506 coupled to the selected word line 518. In yet another example, the page buffer/sense amplifier 704 may also sense a low-power signal from a bit line 516 indicating the data bit stored in a memory cell 506 and amplify the small voltage swing to an identifiable logic level in the read operation. The column decoder/bit line driver 706 may be configured to be controlled by the control logic 712 and select one or more NAND memory strings 508 by applying a bit line voltage generated by the voltage generator 710.

The row decoder/word line driver 708 may be configured to be controlled by the control logic 712, and select/deselect the memory blocks 504 of the memory cell array 501 and select/deselect the word lines 518 of the memory block 504. The row decoder/word line driver 708 may be further configured to drive word lines 518 using word line voltages generated by the voltage generator 710. In some implementations, the row decoder/word line driver 708 may also select/deselect and drive SSG lines 515 and DSG lines 513. As detailed in the following, the row decoder/word line driver 708 is configured to perform the erase operation on the memory cells 506 coupled to the (one or more) selected word lines 518. The voltage generator 710 may be configured to be controlled by the control logic 712 and generate word line voltages to be provided to the memory cell array 501 (such as read voltage, program voltage, pass voltage, local voltage and verification voltage), the bit line voltage and the source line voltage etc.

The control logic 712 may be coupled to each circuit described above and configured to control operations of each peripheral circuit. The register 714 may be coupled to the control logic 712 and include a status register, a command register and an address register to store status information, command operation codes (OP codes) and command addresses for controlling operations of each of the peripheral circuits. The interface 716 may be coupled to the control logic 712, and serve as a control buffer to buffer control commands received from the host (not shown) and relay them to the control logic 712, and buffer status information received from the control logic 712 and relay them to the host. The interface 716 may be further coupled to the column decoder/bit line driver 706 via the data bus 718 and serve as a data I/O interface and a data buffer to buffer data and relay it to the memory cell array 501 or relay or buffer data from the memory cell array 501.

Figure 8:
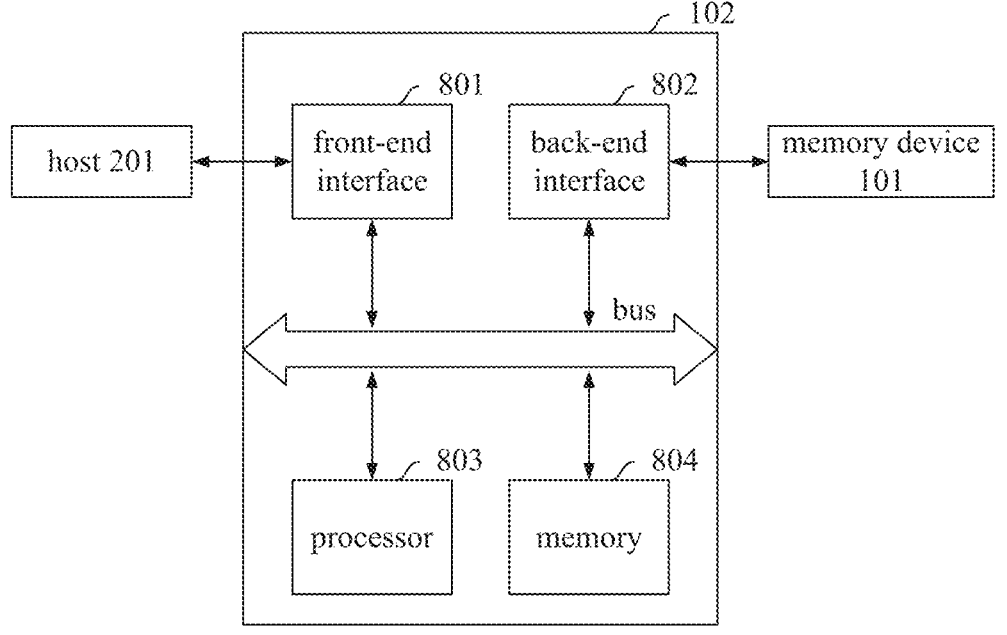
FIG. 8 is a structure diagram of a memory controller provided in an example of the present application.

For the memory controller 102, referring to FIG. 8, which illustrates an example structure diagram of the memory controller 102 provided in an example of the present application. As shown in FIG. 8, the memory controller 102 may include a front-end interface 801, a back-end interface 802, a processor 803 and a memory 804, wherein the above-described components 801, 802, 803 and 804 in the memory controller 102 may share the transmitted signals inside the memory controller 102 via the internal bus. In some examples, the front-end interface 801 may connect the host and the memory system 100 in response to the protocol for the host coupled with the memory system 100 and the front-end interface 801 exchanges the transmitted commands and data operations between the host and the memory system 100. The front-end interface 801 may process the commands and data transmitted by the host and may include at least one of: a universal serial bus (USB), a multi-media card (MMC), a peripheral component interconnect express (PCI-e or PCIe), a small computer system interface (SCSI), a serial SCSI (SAS), a serial advanced technology attachment (SATA), a parallel advanced technology attachment (PATA), a small computer system interface (SCSI), an enhanced small disk interface (ESDI) and an integrated electronic driver (IDE). In some examples, the front-end interface 801 may include a component through which the memory system 100 exchange data with the host, which may be implemented with a firmware known as the host interface layer (HIL).

The back-end interface 802 may be the interface through which the memory controller 102 transmits commands and data to the coupled memory device, which allows the memory controller 102 to control the coupled memory device in response to the request transmitted from the host. The back-end interface 802 may be configured to generate control signals for controlling the coupled memory device. In some examples, if the coupled memory device is a NAND flash memory, the back-end interface 802 may write data to or read data from the coupled memory device under the control of the processor 803. The back-end interface 802 may process commands and data between the memory controller 102 and the coupled memory device, for example, the operations of NAND flash interface, particularly the operations between the memory controller 102 and the coupled memory device. According to an example, the back-end interface 802 may be implemented as a component for exchanging data with the coupled memory device with a firmware known as flash interface layer (FIL).

The processor 803 may be implemented with a microprocessor or a central processing unit (CPU). The memory system 100 may include one or more processors 803. The processor 803 may control all operations of the memory system 100. By way of illustration and not limitation, the processor 803 may control the programming operation or read operation of the coupled memory device in response to the write request or read request from the host. According to an example, the processor 803 may control all operations of the memory system 100 by using or running a firmware. In the present application, the firmware may include the flash transformation layer (FTL). The host may transmit requests related to the write operation and the read operation to the coupled memory device via FTL. For example, while executing the operation requested from the host in the coupled memory device, the memory controller 102 uses the processor 803 to process instructions or commands related to commands from the host. The memory controller 102 may perform foreground operations such as command operations corresponding to commands input from the host, such as programming operation corresponding to the write command, read operation corresponding to read command, erase/discard operation corresponding to the erase/discard command and parameter setting operation corresponding to the setting parameter command or setting feature command with a setting command.

For another example, the memory controller 102 may perform background operations on the coupled memory device through the processor 803. By way of illustration and not limitation, these background operations may include garbage collecting (GC) operation, wear-leveling (WL) operation and bad block management operation for checking or searching bad blocks. The garbage collecting operation may include the operation of copying and processing data stored in a memory block in the memory device into another memory block. The wear-leveling operation may include the operation of exchanging and processing the stored data between memory blocks of the memory device. The bad block management operation may include checking and processing bad blocks in memory blocks in the coupled memory device.

The memory 804 may be the operating memory of the memory controller 102 which is configured to store data for driving the memory controller 102. More particularly, while the memory controller 102 controls the memory device in response to the request from the host, the memory 804 may store the firmware driven by the processor 803 and data (such as metadata) required for driving the firmware.

The memory 804 may also be the buffer memory of the memory controller 102 which is configured to temporarily store the written data transmitted from the host to the coupled memory device and the read data transmitted from the coupled memory device to the host. The memory 804 may include a program memory, a data memory, a write buffer/cache, a read buffer/cache, a data buffer/cache and a mapping buffer/cache for storing the written data and read data. The memory 804 may be implemented with a volatile memory. The memory 804 may be implemented with at least one of a static random-access memory (SRAM) and a dynamic random-access memory (DRAM).

While FIG. 8 shows the memory 804 is included in the memory controller 102, the present application is not limited thereto. In an implementation, the memory 804 may be included outside of the memory controller 102 and the memory controller 102 may input and output data to the memory 804 via a separate memory interface (not shown). In some examples, the host assigns a portion of space in the memory for SSD. The memory controller of the SSD invokes the portion of the memory of the host as its own memory via the front-end interface, i.e., the host memory buffer (HBM) technology.

Based on the afore-mentioned memory device, memory controller and memory system, in some specific application examples, when a memory area in the memory device 101 has not been operated for a period of time, i.e., after the memory area in the memory device 101 has been idle for a period of time without being programmed, read or erased, when it is required to read the idle memory area, a situation in which a fail bit count (FBC) is high may occur for a first read, which results in more reading errors, and the FBC will reduce to normal level in subsequent reads. This phenomenon may be referred to as temporary read errors (TRE). TRE will degrade the QoS of the memory system to a certain degree.

When the memory area in the memory device 101 has been idle for a period of time without any operation, the memory device 101 may be in a powered-up state but the word lines or the bit lines are not applied with corresponding operating voltages. The memory device 101 may also be in a powered-off state (such as off state). Then TRE phenomenon might occur while recovering to an operating state from the powered-off state. The TRE phenomenon while recovering from the non-operating state when powered-off to the operating state when powered-up again is more severe than recovering from the non-operating state when powered-up to the operating state.

The reason of TRE for NAND memory device may be explained according to the physical structure of the memory cell. In some examples, as shown in FIG. 6, the NAND memory string 508 has a semiconductor channel that may include polysilicon or other semiconductor material. The difference in occupancy of grain boundary traps (GBT) of the semiconductor channel is one of the reasons for the large difference between FBCs of the first read operation and the second read operation. Considering the semiconductor channel of polysilicon as an example, when the memory cells in the NAND memory string 508 have been programmed (written), due to the high voltage of the word line, the chance for the polysilicon channel to be in GBT of quasi-Fermi level is occupied. While after the programming completes, as the word line voltage decreases from the programming voltage to 0V gradually, electrons in GBTs of different energy levels would gradually migrate and result in leakage. While the NAND memory string 508 becomes the non-operating state without being programmed, read or erased from the operating state, the GBTs resulting in leakage in the polysilicon channel would be more, resulting in a lower GBT occupancy. While the NAND memory string 508 recovers to the operating state, a higher read FBC may occur due to the lower GBT occupancy for the first read operation. In some other examples, the charge trapping/storage layer of the NAND memory string 508 may also reduce the GBT occupancy since the word line is not applied with voltage, which would also result in TRE phenomenon of the memory device 101. Illustratively, cold data is stored in some memory areas in the memory device 101, which would not be programmed, read or erased frequently. The memory areas storing the cold data would be in un-accessed state for a long period of time and when they are recovered to the operating state, severe TRE would occur with a high FBC for the first read.

For the second read operation after the first read operation, since the read voltage or pass voltage (Vpass) is applied on the word line for the first read operation and the pass voltage may be greater than 5V, GBTs resulting in leakage in the polysilicon channel are filled up again, resulting in a high GBT occupancy which is close to that as just programmed and a small read FBC. It can be seen that when the polysilicon channel has a high GBT occupancy, the read FBC is small. The longer the processing duration (lasting duration) for the first read operation is, the longer the word line is applied with voltage, and the more the GBTs resulting in leakage are filled up, and the fewer read FBC there are. Here, the non-operating states include the powered-up state and the powered-off state. The TRE when recovering from the non-operating state when powered-off to the operating state may be more severe than the TRE when recovering from the non-operating state when powered-up to the operating state. The TRE under low temperature is more severe than the TRE under high temperature. The thicker the polysilicon channel layer is, the more severe the TRE is. The more severe the TRE is, the more processing duration is needed for the first read to eliminate the TRE.

In some illustrative examples of the present application, the memory controller performs dummy read operation on the whole NAND flash at background periodically to recover the NAND flash from idle state to active state and then perform reading, such that the FBC would reduce. The dummy read may refer to the read command transmitted by the memory controller to the memory device, in response to which the memory device performs read operation but the read data may not be transmitted to the memory controller or the host. If one clock cycle is the time to complete one dummy read operation, based on the demand of eliminating TRE, it is possible to use dummy read operations for a plurality of successive clock cycles. The duration of these clock cycles may be referred to the total processing duration of the dummy read. That is, the dummy read needs to last for a period of time, i.e., the total processing duration, such as 60 ms or longer. The memory controller determines the memory device recovers to normal read level by monitoring the FBC of dummy read to be smaller than the preset value for normal reading, such that the memory system recovers to normal read operation. In order to determine the processing duration of dummy read operation, it is possible to set dummy read operations with different processing durations for the memory device and test the read FBCs to determine the duration, and determine the duration for eliminating the TRE under various conditions by establishing testing models and utilizing machine learning and big data analysis. Based on this, it is possible to appropriately increase the processing duration for better reading effects.

It is also found in examples of the present application that the timing for occurrence and eliminating of the first read issue are affected by temperature significantly. That is, the higher the temperature is, the more severe the TRE is, and the shorter the time intervals between occurrences is; the lower the temperature is, the less severe the TRE is, and the longer the time intervals between occurrences is. Accordingly, in some examples, a time interval (such as the second duration) between periodic dummy reads under a certain typical operating temperature is set. Then, the memory controller may acquire the operating temperature of the memory device 101 at background in the time sequence and in turn determine an equivalent duration under a set temperature (typical operating temperature) of the first duration for the operating temperature, and accumulate the equivalent duration until the accumulated equivalent duration is greater than or equal to the time interval between the periodic dummy reads under the typical operating temperature, and then perform the dummy read. The above process is cycled to recover the NAND flash from idle state to active state and then perform read operation to the NAND flash to reduce the FBC. In this manner, it is possible to eliminate the first read issue under various temperature situation, avoid QoS issue due to inadequately elimination effect because of the too long dummy read interval under high temperature, and also prevent the too short dummy read interval under low temperature from influencing the read/write performance of the host.

Here, the set temperature or typical operating temperature may be the temperature under which the memory device operates for long term, such as 55 Degrees Celsius (° C.). The second duration may be the time interval for performing the dummy read periodically under the set temperature. The determination of the second duration can be done by determining the time interval for eliminating the first read issue in time under the set temperature by establishing a test model and using machine learning and big data analysis.

Here, the first duration for which the operating temperature lasts may refer to the time interval between two adjacent measurements of the operating temperatures of the memory device. The time interval between different two adjacent measurements of the operating temperatures of the memory device may be same or may be different. That is, the first duration for which each of the operating temperatures lasts is equal. In some other examples, the first durations for which different operating temperatures last are not equal.

In some examples, each of the operating temperatures may be the average temperature of the memory device within the corresponding first duration. For example, the operating temperatures of the memory device for adjacent two measurements are T1 and T2 respectively, wherein the operating temperature used in the calculation process is (T1+T2)/2.

In case that the first duration for which each operating temperature lasts is equal, in some examples, the operating temperature of the memory device is greater than or equal to the first temperature and less than or equal to the second temperature.

The first duration is smaller than the time interval with which the memory device is triggered periodically to perform the dummy read operation while the memory device is operating under the second temperature.

That is, the operating temperature range for the memory device may be between the first temperature and the second temperature. For example, a range of the operating temperature of the memory device is −20° C. to 80° C., including −20° C. and/or 80° C., wherein the first temperature may be −20° C. and the second temperature may be 80° C. That is, the operating temperature of the memory device may be greater than or equal to −20° C. and less than or equal to 80° C. Based on this, the first duration may be selected to be less than the time interval with which the memory device is triggered periodically to perform the dummy read while the memory device is operating under the second temperature. Illustratively, for example, the time interval with which the memory device performs the dummy read periodically when operating under 80° C. is 2 hours (h). Then, the first duration may be selected to be any duration less than 2 h, such as 1 h.

In some examples, the set temperature is smaller than the second temperature, and the time interval with which the memory device is triggered periodically to perform the dummy read operation while the memory device is operating under the second temperature is smaller than the second duration and the equivalent duration of the time interval under the set temperature is equal to or greater than the second duration.

The set temperature is smaller than the second temperature. For example, the set temperature is 55° C. and the second temperature is 80° C. The time interval with which the memory device performs the dummy read periodically when operating under 80° C., for example, 2 h, is smaller than the time interval with which the memory device performs the dummy read periodically when operating under 55° C., for example, 6 h. However, the equivalent duration under 55° C. of 2h for which 80° C. lasts is greater than 6 h.

In case that the different operating temperatures correspond to different first durations, the first durations are in negative correlation with the operating temperatures. That is, the memory device operates in a scenario in which temperature does not change frequently. Since the operating temperature does not change drastically, its durations under certain operating temperatures are different. In scenarios in which the operating temperature is higher, the first duration for the operating temperature is shorter. On the contrary, in scenarios in which the operating temperature is lower, the first duration for the operating temperature is longer. It is to be noted that the first duration is the duration for calculating equivalent duration under the set temperature. In practical application process, the time interval with which the memory device acquires its operating temperature may be further smaller than the first duration. For example, the time interval for acquisition is 10 minutes (min). At this time, it is possible to determine the first duration according to the acquired operating temperature and the time interval for acquisition.

One implementation may be as follows. The time intervals for which operating temperatures of two adjacent acquisitions in time sequence have a difference with an absolute value smaller than a preset threshold such as 0.2°

C. are accumulated and the accumulating result is the first duration for which one operating temperature lasts.

Illustratively, assuming that operating temperatures acquired with every 10 min interval in time sequence are respectively: 55° C., 55.1° C., 55.05° C., 54.98° C. and 56° C., then the first duration is the sum of three 10 mins, namely 10 min of (55° C., 55.1° C.), 10 min of (55.1° C., 55.05° C.) and 10 min of (55.05° C., 54.98° C.), i.e., 30 min. It should be understood that in practical application process, there should be other calculation manners which will not be described any more here.

In some examples, the equivalent duration of the first duration under the set temperature is in positive correlation with the operating temperature of the memory device. That is, the higher the operating temperature is, the longer the equivalent duration of the first duration under the set temperature is; and the lower the operating temperature is, the shorter the equivalent duration of the first duration under the set temperature is.

In some examples, the memory controller may be further configured to determine the equivalent duration under the set temperature of the first duration corresponding to the operating temperature according a mapping relationship and the operating temperature, wherein the mapping relationship includes: a fitting function between the operating temperature and the equivalent duration or a mapping table between the operating temperature and the equivalent duration; wherein the fitting function includes an exponential function or a multi segment linear function of which each segment of linear function corresponds to a temperature interval in a range of the operating temperature of the memory device.

In particular, if the mapping relationship includes an exponential function such as $Tequivalent=A*EXP(Bx)$, wherein Tequivalent is the equivalent duration and x is the first duration, then on this basis, the memory controller invokes the exponential function and calculates the equivalent duration under the set temperature of the first duration corresponding to the operating temperature according to the exponential function.

Illustratively, assuming that $Tequivalent=154.84*EXP(0.0615x)$, if the operating temperature is 77.2° C. and the first duration is 1 h, then the equivalent duration is 17858 seconds(s)=4.96 h.

If the mapping relationship includes a multi segment linear function, then, the temperature interval to which the measured operating temperature belongs is determined, and then the linear function corresponding to the temperature interval to which the operating temperature belongs is obtained. Thereafter, the equivalent duration under the set temperature of the first duration corresponding to the operating temperature is determined according to the corresponding linear function.

Illustratively, if the operating temperature is 77.2° C. and its corresponding temperature interval is (70, 80], if the determined linear function is: $Tequivalent=930.74x−54312$ and the first duration is 1 h, then the calculated equivalent duration is 17541 s=4.87 h.

In some examples, the mapping relationship may further include a mapping table including a plurality of operating temperatures and the equivalent duration under the set temperature of the first duration corresponding to each operating temperature. It is to be noted that the value of each operating temperature in the mapping table is an integer and the temperature difference between two adjacent operating temperatures is the same.

Based on the mapping table, determining the equivalent duration under set temperature of the first duration corresponding to the operating temperature according to the mapping relationship and the operating temperature may include: recording the acquired operating temperature as the first value; then pre-processing the first value to obtain a second value belonging to integers, and next looking up for the equivalent duration corresponding to the second value from the mapping table. The equivalent duration corresponding to the second value is the equivalent duration corresponding to the acquired operating temperature of the memory device.

The operation of pre-processing the first value to obtain the second value belonging to integers may include: rounding the first value for the first time to obtain a first intermediate value greater than or equal to the first value; determining the quotient of the first intermediate value divided by the temperature difference between two adjacent temperatures in the mapping table; rounding the quotient for the second time to obtain a second intermediate value less than or equal to the quotient; and determining the product of the second intermediate value and the temperature difference as the second value.

Illustratively, the mapping table is as shown in Table 1.

TABLE 1

| Mapping Table | | | |
| --- | --- | --- | --- |
| T (temperature ° C.) | s(second) | minute (min) | Hour (h) |
| 85 | 32400 | 540.00 | 9 |
| 80 | 20382 | 339.70 | 5.6617 |
| 75 | 15024 | 250.40 | 4.1733 |
| 70 | 11075 | 184.58 | 3.0763 |
| 65 | 8163 | 136.06 | 2.2676 |
| 60 | 6017 | 100.29 | 1.6715 |

The above-described calculation process may be described as follows. Assuming that the first value is 77.2, the rounding for the first time is rounding up the first value to obtain the first intermediate value of 78. Then, the first intermediate value is divided by the temperature difference to obtain the quotient, i.e. (78/5)=15.6. Next, the rounding the quotient for the second time is rounding the quotient to the nearest integer according to rounding off rule to obtain the second intermediate value. For example, 15.6 is rounded to 16, i.e., the second intermediate value. Then, the second intermediate value is multiplied by the temperature difference to obtain the second value, for example, 16*5=80. That is, the second value is 80. Then, the equivalent duration of the first duration such as 1 h under 80° C. is obtained as 20382 s=5.66 h from the mapping table such as Table 1.

In some examples, the memory controller may be further configured to transmit a dummy read command to the memory device in response to the accumulated equivalent duration being greater than or equal to the second duration.

The memory device is configured to perform the dummy read operation in response to the dummy read command.

It is to be noted that, it is that each time the accumulated equivalent duration is greater than or equal to the second duration, the memory controller transmits the dummy read command to the memory device such that the memory device performs the dummy read operation.

Illustratively, the first durations are the same and are all 1 h, and the set temperature is 55° C. After the accumulated equivalent duration is greater than or equal to 6 h, the next round of dummy read is triggered and the timing is reset to 0, and the accumulation restarts. For example, the average temperatures for each 1 h in 10 h are 70° C., 60° C., 65° C., 50° C., 40° C., 45° C., 45° C., 50° C., 60° C. and 55° C. respectively, the accumulated equivalent duration of the first 3h under 55° C. is 7.0154 h>=6 h, which triggers the dummy read and the timing is reset to 0. After 7 h, the equivalent duration under 55° C. is 6.3203 hr>=6 hr, which triggers the dummy read again.

In some examples, the memory device is configured to wait for a third duration after being powered up and perform at least one dummy read operation.

It is to be noted that as described before, the TRE for recovering from the non-operating state when powered-off to the operating state will be more severe than the TRE for recovering from the non-operating state when powered-up to the operating state. Then, in order to eliminate the TRE, more clock cycles of dummy reads may be performed (as described before, one clock cycle corresponds to one dummy read operation) to increase the total processing duration for the dummy reads and eliminate the TRE.

In some examples, the memory device may include at least one memory block. The memory controller is further configured to control the memory device to perform the dummy read operation on each available memory block in the at least one memory blocks in response to the accumulated equivalent duration being greater than or equal to the second duration.

It is to be noted that the memory block may be the memory block 504 as shown in FIG. 5. The available memory block may refer to the memory block that stores valid data. That is, the memory controller performs the dummy read operation on each available memory block in the at least one memory blocks contained in the memory device when the accumulated equivalent duration is greater than or equal to the second duration. Illustratively, the dummy read is performed on the entire disk of SSD.

In some examples, the memory controller can also be configured to transmit the dummy read command in batch to the memory device until the memory device has performed the dummy read operation on each available memory block, wherein the time interval between two adjacent dummy read operations performed on each available memory block is the accumulated equivalent duration that is greater than or equal to the second duration.

What is described here is since there are many memory blocks that need to perform dummy reads in the entire memory device, the number of memory blocks that can be controlled by the memory controller when it transmits the command one time is limited, or for other reasons, many memory blocks are divided into batches for dummy reads to prevent too much contents of the transmitted command from causing too long transmission time and influencing transmission and reception of other normal operation commands. It should be understood that no matter how many batches of dummy read command are transmitted, these dummy read commands will be transmitted within the time interval between two adjacent dummy read operations which is the accumulated equivalent duration. The time interval between two adjacent dummy read operations on each available memory block is the accumulated equivalent duration this time.

Figure 9:
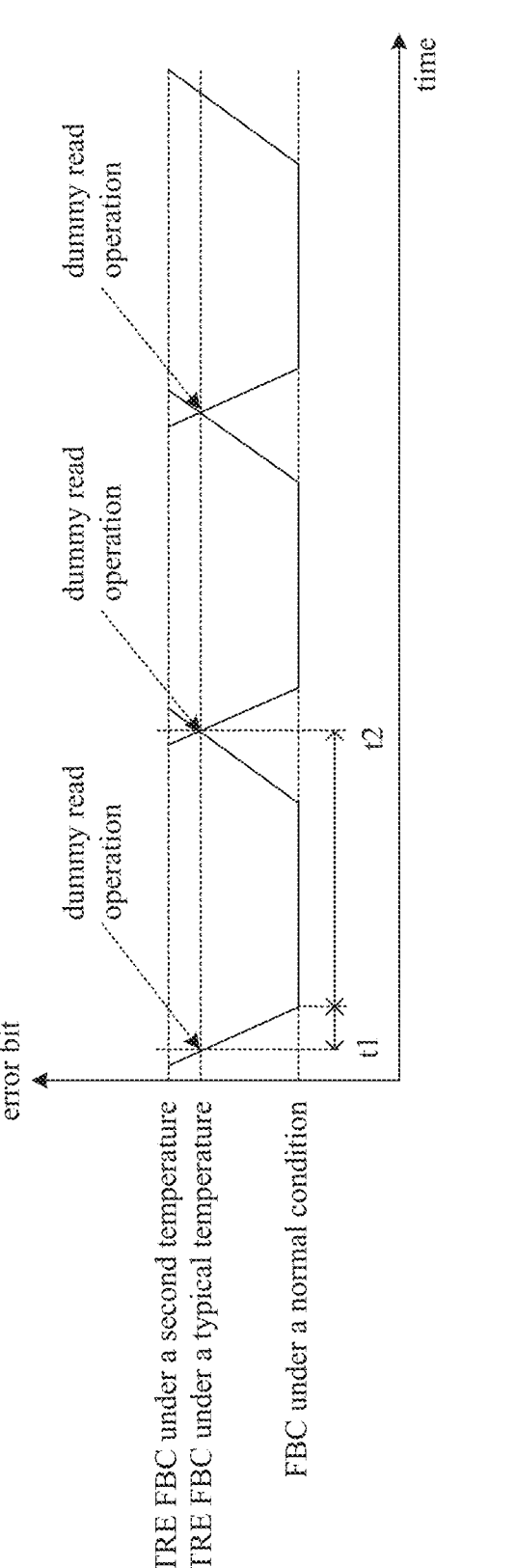
FIG. 9 is a diagram of time of occurring TRE under different temperatures and FBC provided in an example of the present application.
Figure 10:
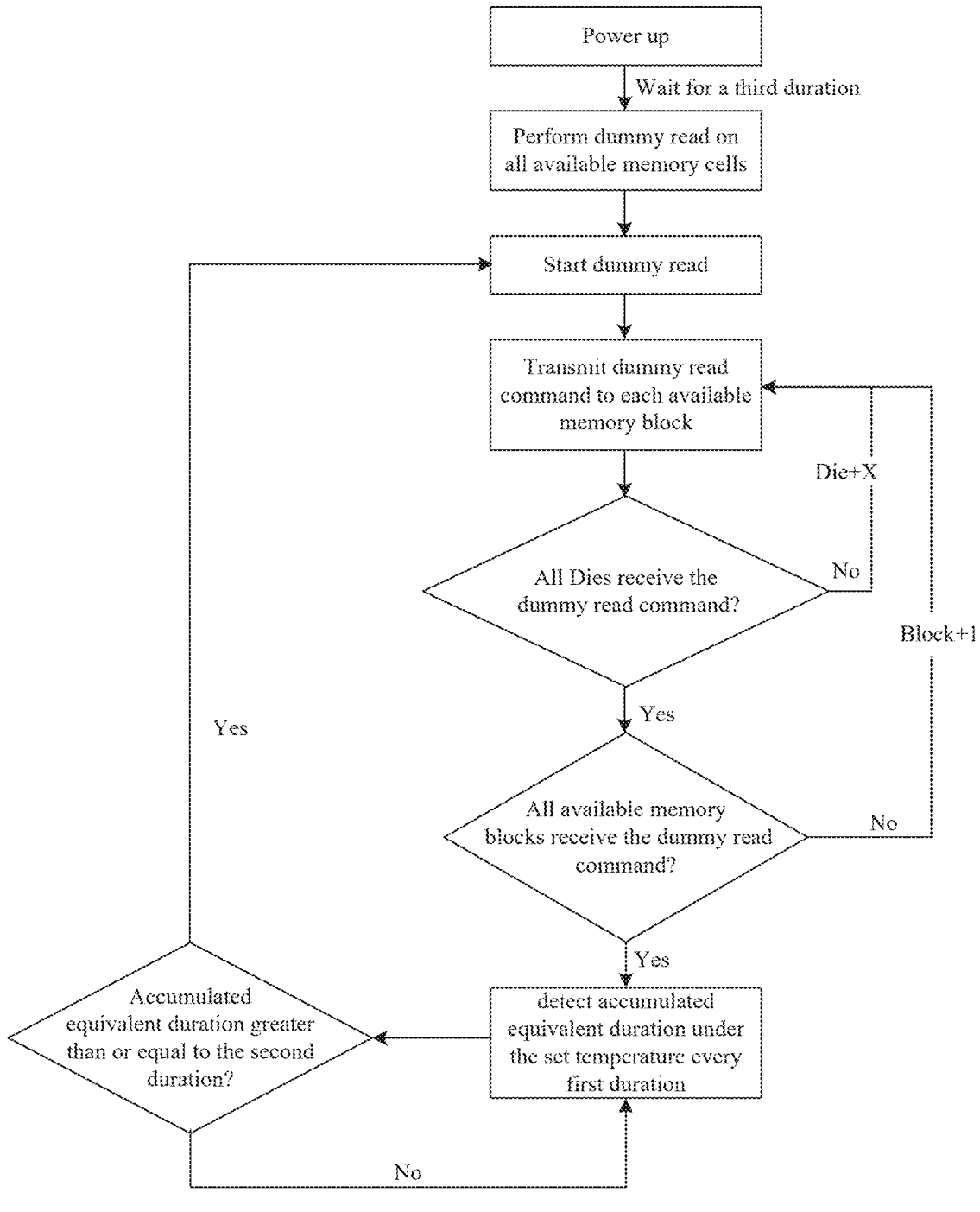
FIG. 10 is a flow diagram of processing TRE by a memory system provided in an example of the present application.

In order to understand the present application, please refer to FIGS. 9 and 10. FIG. 9 is a diagram of the time of occurring TRE and the FBC under different temperatures provided in an example of the present application; and FIG. 10 is a flow diagram of processing TRE by a memory system provided in an example of the present application.

Referring to FIG. 9, the second temperature is higher than the typical temperature which is higher than a temperature under a normal condition such as the first temperature. Under the second temperature, TRE is severe and there are many FBCs, under the first temperature, TRE is less severe and there are less FBCs. The duration between t1~t2 is the second duration such as 6 h. Under the typical temperature, a dummy read operation is performed each time a second duration elapses. In the examples of the present application, the equivalent duration is calculated and accumulated for every interval of tC such as the first duration, 1 h. When the time threshold tG (second duration, such as 6 hr) under a typical temperature such as 55° C. is reached, dummy read on (each available memory block of) the entire disk is triggered to eliminate the first read issue of all blocks.

In particular, as shown in FIG. 10, the operation flow of the memory system includes: powering up, i.e., the memory system is powered up to initialize so as to upload some necessary programs; then after waiting for a third duration, performing at least one dummy read operation, (i.e. dummy read operation after being powered up) on all available memory blocks; then, monitoring, by the memory controller at background until the accumulated equivalent duration is greater than or equal to the second duration to start dummy read; transmitting the dummy read command in batch to each available memory block, e.g., the transmitting is performed on a basis of dummy read command for one Die until each available memory block receives the dummy read command and the dummy read operation is performed. The calculation and detection of accumulated equivalent duration have been described in detail before and will not be described again.

It should be understood that in practical application process, the memory cell array of the memory device may contain a plurality of dies; each die contains a plurality of planes; each plane contains a plurality of blocks; and each block contains a plurality of pages. Accordingly, for the above-described transmitting the dummy read command in batch, it is possible to transmit the command in batch on one die basis.

With the memory system provided in examples of the present application, the physical time is transformed into an equivalent time under a certain temperature according to the current practical temperature, and dummy read is triggered to eliminate the first read issue when an equivalent time threshold under a certain temperature is achieved. It is possible to avoid QoS issue due to inadequately elimination effect because of the too long dummy read interval under high temperature, and also prevent the too short dummy read interval under low temperature from influencing the read/write performance of the host; adapt to eliminate the first read issue under scenarios in which temperature changes frequently without influencing read/write performance.

Based on the inventive concept of the present application, an example of the present application further provides an operating method of a memory system as shown in FIG. 11, that may include:

operation 1101: acquiring operating temperatures of the memory device in the memory system in time sequence; and determining an equivalent duration under a set temperature of a first duration for which the operating temperature lasts;

operation 1102: accumulating the equivalent duration corresponding to the first duration;

operation 1103: controlling the memory device to perform dummy read operation in response to the accumulated equivalent duration being greater than or equal to a second duration; wherein the second duration is the time interval with which the memory device is triggered periodically to perform the dummy read operation under the set temperature.

In some examples, the equivalent duration of the first duration under the set temperature is in positive correlation with the operating temperature, and said determining the equivalent duration under the set temperature of the first duration for which the operating temperature lasts includes: determining the equivalent duration under the set temperature of the first duration corresponding to the operating temperature according a mapping relationship and the operating temperature, wherein the mapping relationship includes: a fitting function between the operating temperature and the equivalent duration or a mapping table between the operating temperature and the equivalent duration; wherein the fitting function includes an exponential function or a multi segment linear function of which each segment of linear function corresponds to a temperature interval in a range of the operating temperature corresponding to the memory device.

In some examples, the mapping relationship includes the exponential function, and said determining the equivalent duration under the set temperature of the first duration corresponding to the operating temperature according to the mapping relationship and the operating temperature includes: invoking the exponential function and calculating the equivalent duration under the set temperature of the first duration corresponding to the operating temperature according to the exponential function.

In some examples, the mapping relationship includes the multi segment linear function, and said determining the equivalent duration under the set temperature of the first duration corresponding to the operating temperature according to the mapping relationship and the operating temperature includes: determining the temperature interval to which the operating temperature belongs; obtaining a linear function corresponding to the temperature interval to which the operating temperature belongs, and determining the equivalent duration under the set temperature of the first duration corresponding to the operating temperature according to the corresponding linear function.

In some examples, the mapping relationship includes a mapping table including a plurality of operating temperatures and the equivalent duration under the set temperature of the first duration corresponding to each operating temperature; wherein the value of each operating temperature in the mapping table is an integer and the temperature differences between two adjacent operating temperatures are the same; the acquired value of the operating temperature of the memory device is the first value; and said determining the equivalent duration under the set temperature of the first duration corresponding to the operating temperature according to the mapping relationship and the operating temperature includes: pre-processing the first value to obtain a second value; looking up for the equivalent duration corresponding to the second value from the mapping table; wherein the equivalent duration corresponding to the second value is the equivalent duration corresponding to the acquired operating temperature of the memory device.

In some examples, said pre-processing the first value to obtain the second value includes: rounding the first value for the first time to obtain a first intermediate value greater than or equal to the first value; determining the quotient of the first intermediate value divided by the temperature difference; rounding the quotient for the second time to obtain the second intermediate value less than or equal to the quotient; and determining the product of the second intermediate value and the temperature difference as the second value.

In some examples, the method further includes: controlling the memory device to perform the dummy read operation on each available memory block in the plurality of memory blocks contained therein in response to the accumulated equivalent duration being greater than or equal to the second duration.

In some examples, said controlling the memory device to perform the dummy read operation on each available memory block in the plurality of memory blocks contained therein includes: transmitting the dummy read command in batch to the memory device until the memory device has performed the dummy read operation on each available memory block, wherein the time interval between two adjacent dummy read operations performed on each available memory block is the accumulated equivalent duration that is greater than or equal to the second duration.

In some examples, each of the operating temperatures is the average temperature of the memory device within the corresponding first duration.

In some examples, the first duration corresponding to each of the operating temperature is equal; and the first duration is smaller than the time interval with which the memory device is triggered periodically to perform the dummy read operation while the memory device is operating under the second temperature.

In some examples, the first durations corresponding to different operating temperatures are not equal, the first duration is in negative correlation with the operating temperature.

It is to be noted that the operating method of the memory system provided in examples of the present application is based on the operation of the afore-mentioned memory device and thus both of them have the same technical features. Terms appeared in the operating method of the memory system have been explained in detail in the above-mentioned memory system and apply equally herein, therefore will not be described any more.

An example of the present application further provides a readable storage medium having a computer program stored therein, which computer program implements the operating method of any one of the above items when being executed. The afore-mentioned storage medium may be a computer readable storage medium. In some examples, the storage medium may include various media that may store program codes such as a mobile storage apparatus, a read-only memory (ROM), a random-access memory (RAM), a magnetic disk or an optical disk.

In an aspect, an example of the present application provides a memory system comprising: a memory device and a memory controller coupled with the memory device, wherein the memory controller is configured to: acquire operating temperatures of the memory device in time sequence and determine an equivalent duration under a set temperature of a first duration for which the operating temperature lasts; accumulate the equivalent duration corresponding to the first duration; and control the memory device to perform dummy read operation in response to the accumulated duration being greater than or equal to a second duration; wherein the second duration is a time interval for triggering the memory device to perform dummy read operation periodically under the set temperature.

In the above-described scheme, each of said operating temperatures is the average temperature of the memory device within the corresponding first duration.

In the above-described scheme, the first duration corresponding to each of said operating temperatures is equal.

In the above-described scheme, the operating temperature of the memory device is greater than or equal to a first temperature and less than or equal to a second temperature; wherein the first duration is smaller than a time interval with which the memory device is triggered periodically to perform the dummy read operation while the memory device is operating under the second temperature.

In the above-described scheme, the set temperature is smaller than the second temperature, and the time interval with which the memory device is triggered periodically to perform the dummy read operation while the memory device is operating under the second temperature is smaller than the second duration and the equivalent duration of the time interval under the set temperature is equal to or greater than the second duration.

In the above-described scheme, the first durations corresponding to different operating temperatures are not equal.

In the above-described scheme, the first duration is in negative correlation with the operating temperature.

In the above-described scheme, the equivalent duration of the first duration under the set temperature is in positive correlation with the operating temperature of the memory device.

In the above-described scheme, the memory controller is further configured to determine the equivalent duration under the set temperature of the first duration corresponding to the operating temperature according to a mapping relationship and the operating temperature, wherein the mapping relationship includes: a fitting function between the operating temperature and the equivalent duration or a mapping table between the operating temperature and the equivalent duration; wherein the fitting function includes an exponential function or a multi segment linear function in which each segment of the linear function corresponds to a temperature interval in a range of the operating temperature of the memory device.

In the above-described scheme, the memory controller is further configured to transmit a dummy read command to the memory device in response to the accumulated equivalent duration being greater than or equal to the second duration; and the memory device is configured to perform the dummy read operation in response to the dummy read command.

In the above-described scheme, the memory device is configured to wait for a third duration after being powered up and perform the dummy read operation.

In the above-described scheme, the memory device includes at least one memory block; and the memory controller is further configured to control the memory device to perform the dummy read operation on each available memory block in the at least one memory block in response to the accumulated equivalent duration being greater than or equal to the second duration.

In the above-described scheme, the memory controller is further configured to transmit the dummy read command in batch to the memory device until the memory device performs the dummy read operation on each available memory block, wherein the time interval between two adjacent dummy read operations performed on each available memory block is the accumulated equivalent duration that is greater than or equal to the second duration.

In another aspect, an example of the present application provides an operating method of a memory system, including: acquiring operating temperatures of the memory device in the memory system in time sequence and determining an equivalent duration under a set temperature of a first duration for which the operating temperature lasts; accumulating the equivalent duration of the first duration; controlling the memory device to perform dummy read operation in response to the accumulated duration being greater than or equal to a second duration; wherein the second duration is a time interval for triggering the memory device to perform the dummy read operation periodically under the set temperature.

In the above-described scheme, the equivalent duration of the first duration under the set temperature is in positive correlation with the operating temperature, and determining the equivalent duration under the set temperature of the first duration for which the operating temperature lasts includes: determining the equivalent duration under the set temperature of the first duration corresponding to the operating temperature according to a mapping relationship and the operating temperature, wherein the mapping relationship includes: a fitting function between the operating temperature and the equivalent duration or a mapping table between the operating temperature and the equivalent duration; wherein the fitting function includes an exponential function or a multi segment linear function in which each segment of linear function corresponds to a temperature interval in a range of the operating temperature corresponding to the memory device.

In the above-described scheme, the mapping relationship includes the exponential function, and determining the equivalent duration under the set temperature of the first duration corresponding to the operating temperature according to the mapping relationship and the operating temperature includes: invoking the exponential function and calculating the equivalent duration under the set temperature of the first duration corresponding to the operating temperature according to the exponential function.

In the above-described scheme, the mapping relationship includes the multi segment linear function, and determining the equivalent duration under the set temperature of the first duration corresponding to the operating temperature according to the mapping relationship and the operating temperature includes: determining the temperature interval to which the operating temperature belongs; obtaining a linear function corresponding to the temperature interval to which the operating temperature belongs, and determining the equivalent duration under the set temperature of the first duration corresponding to the operating temperature according to the corresponding linear function.

In the above-described scheme, the mapping relationship includes a mapping table including a plurality of operating temperatures and the equivalent duration under the set temperature of the first duration corresponding to each operating temperature; wherein the value of each operating temperature in the mapping table is an integer and the temperature differences between two adjacent operating temperatures are the same; the acquired value of the operating temperature of the memory device is the first value; and determining the equivalent duration under the set temperature of the first duration corresponding to the operating temperature according to the mapping relationship and the operating temperature includes: pre-processing the first value to obtain a second value;

looking up for the equivalent duration corresponding to the second value from the mapping table; wherein the equivalent duration corresponding to the second value is the equivalent duration corresponding to the acquired operating temperature of the memory device.

In the above-described scheme, pre-processing the first value to obtain the second value includes: rounding the first value for the first time to obtain a first intermediate value which is greater than or equal to the first value; determining the quotient of the first intermediate value divided by the temperature difference; rounding the quotient for the second time to obtain the second intermediate value which is less than or equal to the quotient; and determining the product of the second intermediate value and the temperature difference as the second value.

In the above-described scheme, the method further includes: controlling the memory device to perform dummy read operation on each available memory block contained in the plurality of memory blocks contained therein in response to the accumulated equivalent duration being greater than or equal to the second duration.

In the above-described scheme, controlling the memory device to perform dummy read operation on each available memory block contained in the plurality of memory blocks contained therein includes: transmitting dummy read command in batch to the memory device until the memory device performs the dummy read operation on each available memory block, wherein the time interval between two adjacent dummy read operations performed on each available memory block is the accumulated equivalent duration that is greater than or equal to the second duration.

In the above-described scheme, each of the operating temperatures is the average temperature of the memory device within the corresponding first duration.

In the above-described scheme, the first duration corresponding to each of the operating temperatures is equal; and the operating temperature of the memory device is greater than or equal to a first temperature and less than or equal to a second temperature; the first duration is smaller than the time interval with which the memory device is triggered periodically to perform the dummy read operation while the memory device is operating under the second temperature.

In the above-described scheme, the first durations corresponding to different operating temperatures are not equal, the first duration is in negative correlation with the operating temperature.

In yet another aspect, an example of the present application further provides a readable storage medium having a computer program stored therein that implements the operating method of any one of the above items while being executed.

Examples of the present application provide a memory system, an operating method and readable storage medium. The memory system includes: a memory device and a memory controller coupled with the memory device, wherein the memory controller is configured to: acquire operating temperatures of the memory device in time sequence and determine an equivalent duration under a set temperature of a first duration for which the operating temperature lasts; accumulate the equivalent duration corresponding to the first duration; control the memory device to perform dummy read operation in response to the accumulated equivalent duration being greater than or equal to a second duration; wherein the second duration is a time interval for triggering the memory device to perform the dummy read operation periodically under the set temperature. With the memory system provided in examples of the present application, it is possible to effectively mitigate a first read issue, thereby improving the quality of service (QoS) of the memory device by setting a time interval (i.e. the second duration) with which dummy read operation is performed under a typical operating temperature, acquiring the operating temperature of the memory device while the memory system is operating, transforming the duration for which the operating temperature lasts into an equivalent duration under the typical operating temperature, accumulating the equivalent duration in time sequence and performing the dummy read operation while the accumulated equivalent duration is greater than or equal to the second duration.

It is to be noted that the above description is intended to be illustrative rather than limiting. For example, the above-described examples (or one or more aspects thereof) may be used in combination with each other. Other examples may be used, such as those available for one of ordinary skill in the art upon reading the above description. It should be understood that it will not be used to interpret or limit the scope or meaning of the claims. Furthermore, in the above detailed description, various features may be combined to simplify the present disclosure. It should not be understood as meaning the disclosed features that have not been claimed are essential for any claims. To the contrary, the disclosed subject may lie in less than all features of specific disclosed examples. Accordingly, the appended claims are hereby incorporated in the detailed description, wherein each claim serves as a separate example independently and it is contemplated these examples may be combined with each other in various combinations or permutations.

What is claimed is:

1. A memory system comprising a memory device and a memory controller coupled with the memory device, and the memory controller is configured to:

acquire operating temperatures of the memory device in time sequence;

determine an equivalent duration under a set temperature of a first duration for which the operating temperature lasts;

accumulate the equivalent duration corresponding to the first duration; and control the memory device to perform a dummy read operation in response to the accumulated equivalent duration being greater than or equal to a second duration, wherein the second duration is a time interval within which the memory device is triggered periodically to perform the dummy read operation under the set temperature.

2. The memory system of claim 1, wherein each of the operating temperatures is an average temperature of the memory device within the corresponding first duration.

3. The memory system of claim 1, wherein the first duration corresponding to each of the operating temperatures is equal.

4. The memory system of claim 3, wherein the operating temperature of the memory device is greater than or equal to a first temperature and less than or equal to a second temperature, wherein the first duration is smaller than a time interval within which the memory device is triggered periodically to perform the dummy read operation when the memory device is operating under the second temperature.

5. The memory system of claim 4, wherein the set temperature is smaller than the second temperature, and the time interval with which the memory device is triggered periodically to perform the dummy read operation when the memory device is operating under the second temperature is smaller than the second duration and the equivalent duration under the set temperature of the time interval is equal to or greater than the second duration.

6. The memory system of claim 1, wherein first durations corresponding to different operating temperatures are not equal.

7. The memory system of claim 6, wherein the first duration is in negative correlation with the operating temperature.

8. The memory system of claim 1, wherein the equivalent duration of the first duration under the set temperature is in positive correlation with the operating temperature of the memory device.

9. The memory system of claim 8, wherein the memory controller is further configured to determine the equivalent duration under the set temperature of the first duration corresponding to the operating temperature according a mapping relationship and the operating temperature, wherein the mapping relationship includes a fitting function between the operating temperature and the equivalent duration or a mapping table between the operating temperature and the equivalent duration, wherein the fitting function includes an exponential function or a multi segment linear function of which each segment of linear function corresponds to a temperature interval in a range of the operating temperature of the memory device.

10. The memory system of claim 1, wherein the memory controller is further configured to transmit a dummy read command to the memory device in response to the accumulated equivalent duration being greater than or equal to the second duration; and the memory device is configured to perform the dummy read operation in response to the dummy read command.

11. The memory system of claim 1, wherein the memory device is configured to wait for a third duration after being powered up and perform at least one dummy read operation.

12. The memory system of claim 1, wherein the memory device includes at least one memory block, and the memory controller is further configured to control the memory device to perform the dummy read operation on each available memory block in the at least one memory block in response to the accumulated equivalent duration being greater than or equal to the second duration.

13. The memory system of claim 12, wherein the memory controller is further configured to transmit the dummy read command in batch to the memory device until the memory device has performed the dummy read operation on each available memory block, and wherein a time interval between two adjacent dummy read operations performed on each available memory block is the accumulated equivalent duration that is greater than or equal to the second duration.

14. A method of operating a memory system, comprising:

acquiring operating temperatures of a memory device in the memory system in time sequence;

determining an equivalent duration under a set temperature of a first duration for which the operating temperature lasts;

accumulating the equivalent duration corresponding to the first duration; and controlling the memory device to perform dummy read operation in response to the accumulated equivalent duration being greater than or equal to a second duration, wherein the second duration is a time interval with which the memory device is triggered periodically to perform the dummy read operation under the set temperature.

15. The method of claim 14, wherein the equivalent duration of the first duration under the set temperature is in positive correlation with the operating temperature, and determining the equivalent duration under the set temperature of the first duration for which the operating temperature lasts includes determining the equivalent duration under the set temperature of the first duration corresponding to the operating temperature according to a mapping relationship and the operating temperature, wherein the mapping relationship includes: a fitting function between the operating temperature and the equivalent duration or a mapping table between the operating temperature and the equivalent duration, wherein the fitting function includes an exponential function or a multi segment linear function of which each segment of linear function corresponds to a temperature interval in a range of the operating temperature corresponding to the memory device.

16. The method of claim 15, wherein the mapping relationship includes the exponential function, and determining the equivalent duration under the set temperature of the first duration corresponding to the operating temperature according to the mapping relationship and the operating temperature includes:

invoking the exponential function; and calculating the equivalent duration under the set temperature of the first duration corresponding to the operating temperature according to the exponential function.

17. The method of claim 15, wherein the mapping relationship includes the multi segment linear function, and determining the equivalent duration under the set temperature of the first duration corresponding to the operating temperature according to the mapping relationship and the operating temperature includes:

determining a temperature interval to which the operating temperature belongs;

obtaining a linear function corresponding to the temperature interval to which the operating temperature belongs; and determining the equivalent duration under the set temperature of the first duration corresponding to the operating temperature according to the corresponding linear function.

18. The method of claim 15, wherein the mapping relationship includes a mapping table including a plurality of operating temperatures and the equivalent duration under the set temperature of the first duration corresponding to each operating temperature, wherein a value of each operating temperature in the mapping table is an integer and temperature differences between two adjacent operating temperatures are the same, an acquired value of the operating temperature of the memory device is a first value, and determining the equivalent duration under the set temperature of the first duration corresponding to the operating temperature according to the mapping relationship and the operating temperature includes:

pre-processing the first value to obtain a second value; and looking up for the equivalent duration corresponding to the second value from the mapping table, wherein the equivalent duration corresponding to the second value is the equivalent duration corresponding to the acquired operating temperature of the memory device.

19. The method of claim 18, wherein pre-processing the first value to obtain the second value includes:

rounding the first value for a first time to obtain a first intermediate value greater than or equal to the first value;

determining a quotient of the first intermediate value divided by the temperature difference;

rounding the quotient for a second time to obtain a second intermediate value less than or equal to the quotient; and determining a product of the second intermediate value and the temperature difference as the second value.

20. A readable storage medium having a computer program stored therein, which computer program implements an operating method of a memory system when being executed, the operating method including:

acquiring operating temperatures of a memory device in the memory system in time sequence;

determining an equivalent duration under a set temperature of a first duration for which the operating temperature lasts;

accumulating the equivalent duration corresponding to the first duration; and controlling the memory device to perform dummy read operation in response to the accumulated equivalent duration being greater than or equal to a second duration, wherein the second duration is a time interval with which the memory device is triggered periodically to perform the dummy read operation under the set temperature.

* * * * *